(12) United States Patent
Yamaguchi

(10) Patent No.: US 9,093,277 B2
(45) Date of Patent: Jul. 28, 2015

(54) SEMICONDUCTOR DEVICE AND METHOD OF MANUFACTURING THE SAME

(71) Applicant: MITSUBISHI ELECTRIC CORPORATION, Tokyo (JP)

(72) Inventor: Yoshihiro Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/061,417

(22) Filed: Oct. 23, 2013

(65) Prior Publication Data

US 2014/0217600 A1 Aug. 7, 2014

(30) Foreign Application Priority Data

Feb. 6, 2013 (JP) ................... 2013-021036

(51) Int. Cl.
*H01L 23/00* (2006.01)
*H01L 23/48* (2006.01)
*H01L 23/13* (2006.01)
(Continued)

(52) U.S. Cl.
CPC ............... *H01L 24/03* (2013.01); *H01L 23/13* (2013.01); *H01L 23/3128* (2013.01); *H01L 23/3735* (2013.01); *H01L 23/48* (2013.01); *H01L 24/40* (2013.01); *H01L 24/29* (2013.01); *H01L 24/32* (2013.01); *H01L 24/45* (2013.01); *H01L 24/48* (2013.01); *H01L 24/73* (2013.01); *H01L 24/84* (2013.01); *H01L 2224/29101* (2013.01); *H01L 2224/29339* (2013.01); *H01L 2224/40137* (2013.01); *H01L 2224/45124* (2013.01); *H01L 2224/48091* (2013.01); *H01L 2224/73263* (2013.01); *H01L 2224/73265* (2013.01); *H01L 2224/8484* (2013.01); *H01L 2224/84801* (2013.01); *H01L 2224/92246* (2013.01); *H01L 2224/92247* (2013.01); *H01L 2924/10272* (2013.01); *H01L 2924/1305* (2013.01); *H01L 2924/1306* (2013.01); *H01L 2924/13055* (2013.01); *H01L 2924/13091* (2013.01)

(58) Field of Classification Search
CPC . H01L 24/32; H01L 24/28; H01L 2023/4062; H01L 23/142; H01L 23/3128
USPC .......................................................... 257/773
See application file for complete search history.

(56) References Cited

U.S. PATENT DOCUMENTS 5,334,800 A * 8/1994 Kenney .................. 174/250
5,424,918 A * 6/1995 Felps et al. .................... 361/704
(Continued)

FOREIGN PATENT DOCUMENTS

JP 2002-076257 A 3/2002
JP 2005-129624 A 5/2005
(Continued)

OTHER PUBLICATIONS

An Office Action issued by the German Patent Office on Jan. 5, 2015, which corresponds to German Patent Application No. 10 2013 219 959.7 and is related to U.S. Appl. No. 14/061,417; with English language translation.

*Primary Examiner* — Jarrett Stark
(74) *Attorney, Agent, or Firm* — Studebaker & Brackett PC

(57) ABSTRACT

The present invention includes a plate electrode to be a plate-shaped electrode member, an epoxy sheet serving as an integrated insulating sheet and provided on the plate electrode, a double printed board serving as a control board and provided on the epoxy sheet, and a board integrated electrode in which the plate electrode and the double printed board are formed integrally by the epoxy sheet.

5 Claims, 26 Drawing Sheets

(51) Int. Cl.
*H01L 23/31* (2006.01)
*H01L 23/373* (2006.01)

(56) References Cited

U.S. PATENT DOCUMENTS

| | | | | |
|---|---|---|---|---|
| 5,506,375 | A | * | 4/1996 | Kikuchi .................... 178/18.07 |
| 5,667,884 | A | * | 9/1997 | Bolger ......................... 428/323 |
| 5,847,929 | A | * | 12/1998 | Bernier et al. ................ 361/719 |
| 5,901,050 | A | * | 5/1999 | Imai ............................. 361/820 |
| 5,929,375 | A | * | 7/1999 | Glovatsky et al. ............ 174/359 |
| 6,538,313 | B1 | * | 3/2003 | Smith .......................... 257/684 |
| 2002/0024120 | A1 | | 2/2002 | Yoshimatsu et al. |
| 2003/0178726 | A1 | | 9/2003 | Ogawa et al. |
| 2004/0231872 | A1 | * | 11/2004 | Arnold et al. ................ 174/35 R |
| 2008/0180871 | A1 | * | 7/2008 | Hebert et al. ................. 361/106 |
| 2010/0155111 | A1 | * | 6/2010 | Ono .............................. 174/255 |
| 2012/0074516 | A1 | | 3/2012 | Yamaguchi et al. |

FOREIGN PATENT DOCUMENTS

| | | |
|---|---|---|
| JP | 2006-303006 A | 11/2006 |
| JP | 2009-224534 A | 10/2009 |
| JP | 2012-074543 A | 4/2012 |
| JP | 5012772 B2 | 8/2012 |

* cited by examiner

F I G . 7
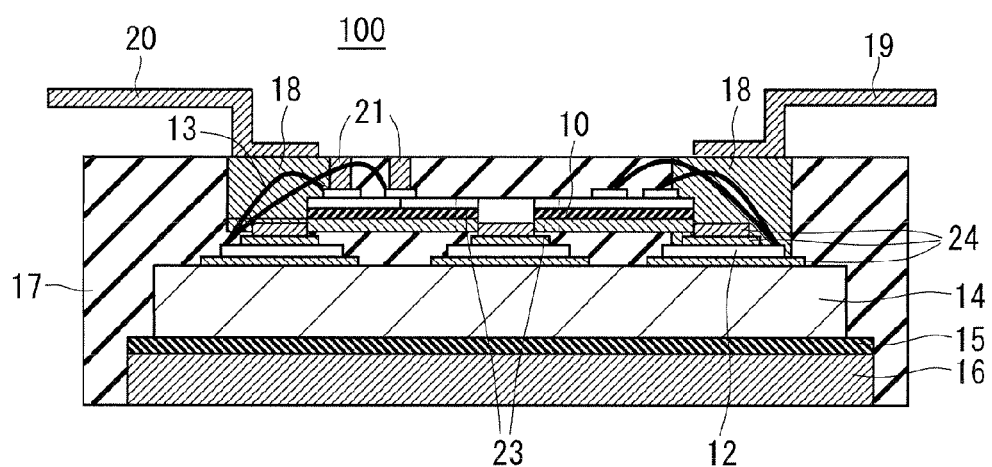

F I G. 1 4
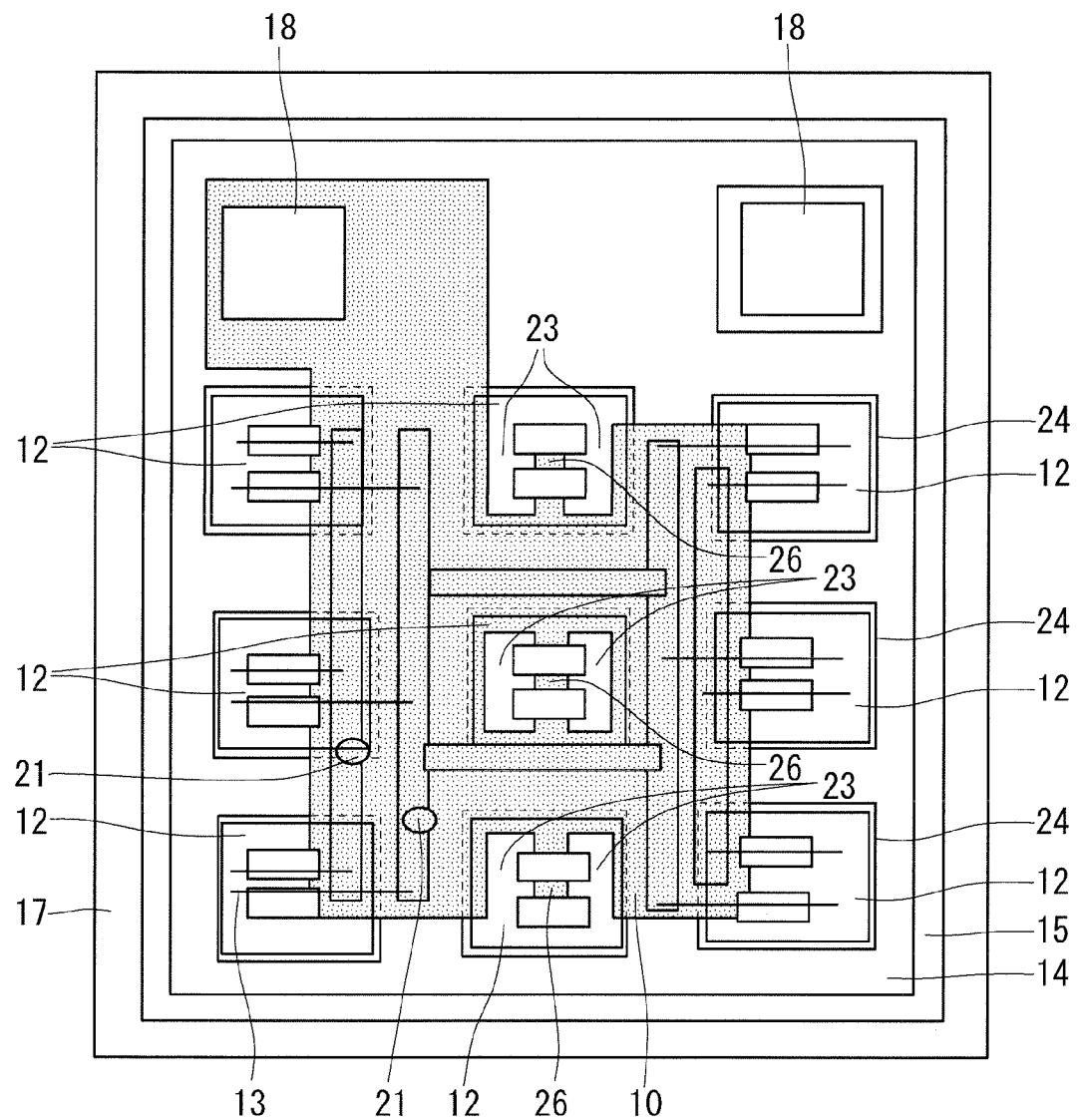

F I G . 1 5
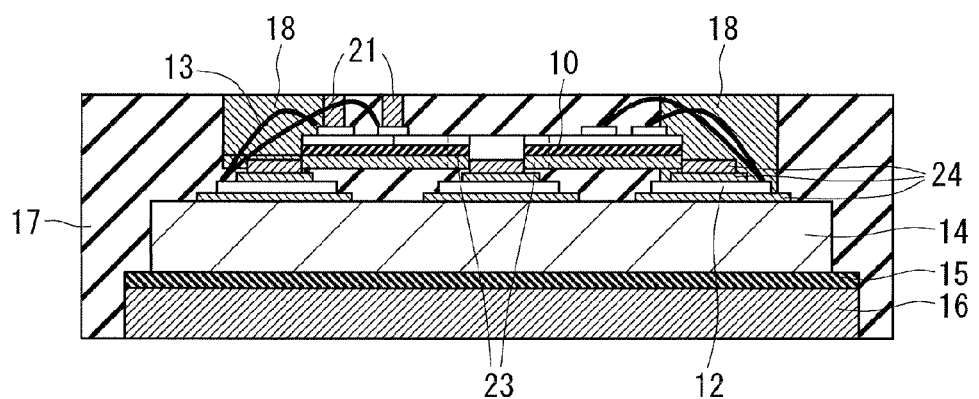

F I G . 1 6
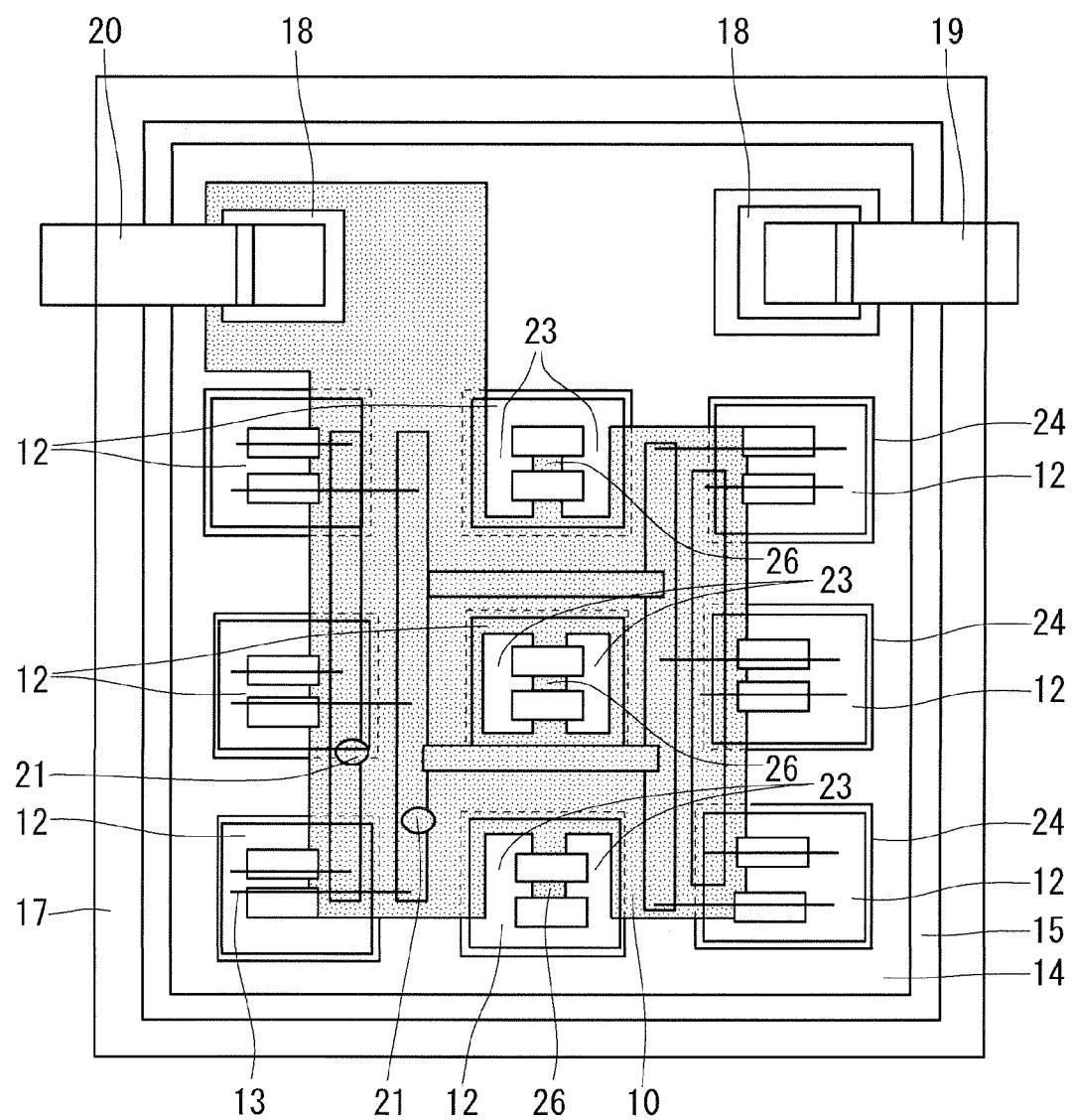

F I G . 1 7
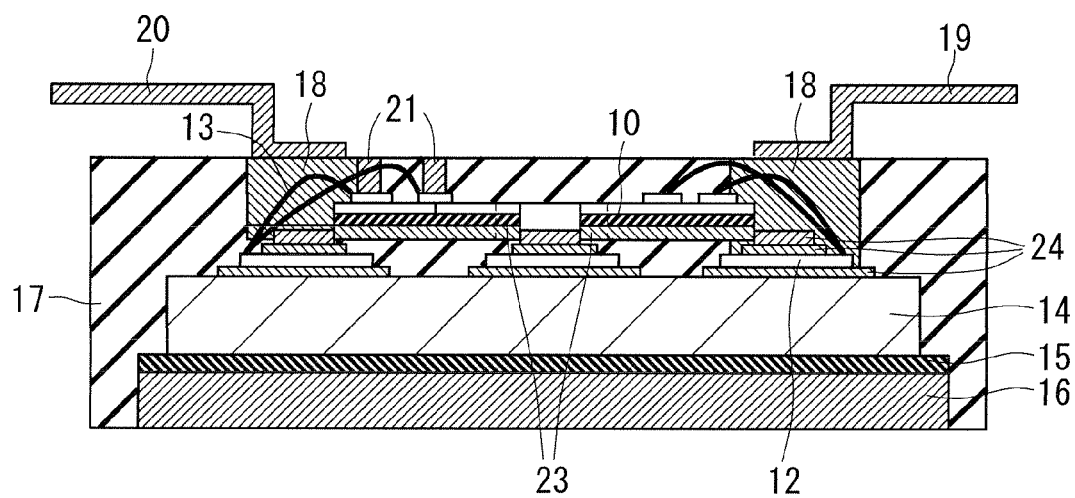

F I G . 2 7
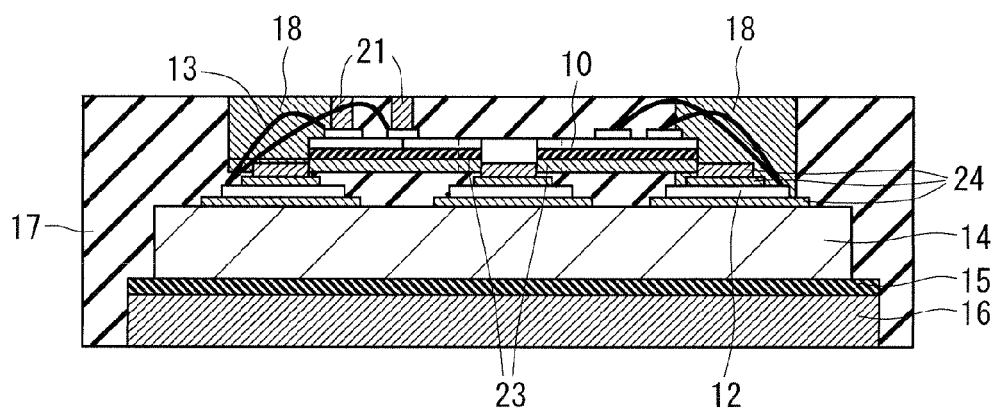

F I G. 2 9
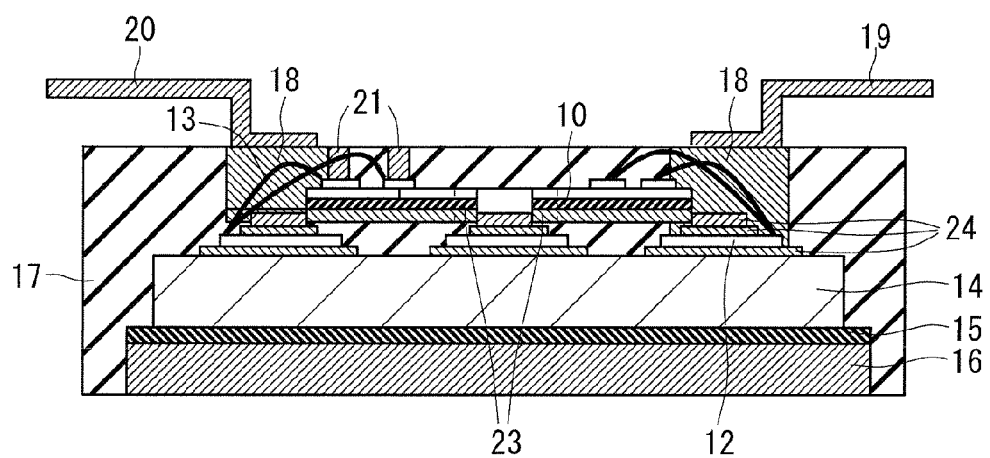

F I G . 3 3
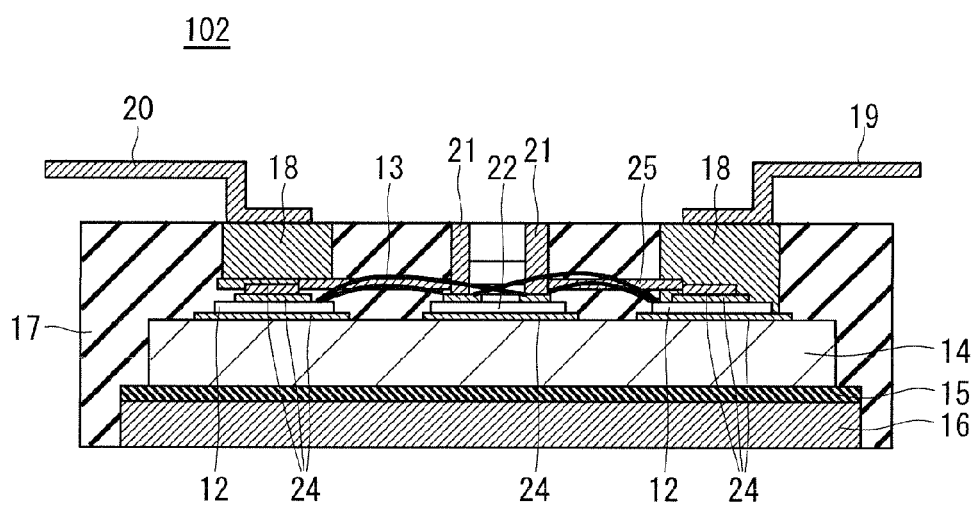

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device.

2. Description of the Background Art

A package of a semiconductor device, for example, a power MOSFET (Metal Oxide Semiconductor Field Effect Transistor), an IGBT (Insulated Gate Bipolar Transistor) which is a power semiconductor device or the like is often formed by resin sealing through transfer molding in respect of a manufacturing cost, a productivity and the like. Also In the case where Si (silicon) and SiC (silicon carbide) that are mainstream base materials are applied to the power semiconductor device, the resin sealing is often carried out through the transfer molding.

For example, Japanese Patent No. 5012772 discloses the semiconductor device subjected to the resin sealing. In the case of the Japanese Patent No. 5012772, there is disclosed the structure in which an electrode erected on a surface of a sealing resin is exposed in consideration of reduction in size of the device and convenience of wiring.

In Japanese Patent Application Laid-Open No. 2012-74543, further, there is used the direct lead bonding method of directly connecting electrodes to each other in place of connection of an emitter electrode and a lead terminal through a bonding wire in order to reduce a power loss in a semiconductor device subjected to transfer molding. Furthermore, the electrode post bonded in such a way as to be erected on the plate electrode disposed on the chip is provided to be exposed to the outside.

Referring to the power semiconductor device, development continuously advances toward application of an element using, as a base material, a material which can be operated at a high temperature and is represented by SiC. Thus, there is a demanded structure in which an operation can be carried out at a high temperature and a capacity can be enlarged.

In the case where the enlargement of the capacity is to be further implemented without increase in size of the device in the semiconductor device, it is necessary to effectively utilize a space in the device by disposition of the electrode of the semiconductor element below the control board or the like as is disclosed in Japanese Patent Application Laid-Open No. 2006-303006, for example.

SUMMARY OF THE INVENTION

It is an object of the present invention to provide a semiconductor device capable of being easily manufactured while implementing enlargement of a capacity, and a method of manufacturing the semiconductor device.

An aspect of the present invention is directed to a semiconductor device including a plate-shaped electrode member, an integrated insulating sheet provided on the electrode member, and a control board provided on the integrated insulating sheet. The semiconductor device includes a board integrated electrode in which the electrode member and the control board are integrally formed by the integrated insulating sheet.

Another aspect of the present invention is directed to a method of manufacturing a semiconductor device including the steps of (a) providing an integrated insulating sheet on a plate-shaped electrode member, (b) providing a control board on the integrated insulating sheet and integrally forming the electrode member and the control board through the integrated insulating sheet, and (c) electrically connecting a board integrated electrode formed integrally in the step (b) to a semiconductor element.

According to the aspects of the present invention, there is provided the board integrated electrode in which the electrode member and the control board are formed integrally through the integrated insulating sheet. Consequently, it is possible to easily carry out the manufacture while implementing enlargement of a capacity.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a sectional view illustrating the semiconductor device according to the preferred embodiment of the present invention;

FIGS. 8 to 17 are views each illustrating a process for manufacturing a semiconductor device according to the preferred embodiment of the present invention;

FIGS. 18 to 29 are views each illustrating a further mode of the process for manufacturing a semiconductor device according to the preferred embodiment of the present invention;

FIG. 33 is a sectional view illustrating the semiconductor device according to the technical premise of the present invention.

DESCRIPTION OF THE PREFERRED EMBODIMENTS

A preferred embodiment according to the present invention will be described below with reference to the accompanying drawings.

Although a term, for example, an upper surface, a lower surface or the like is used in the present specification, the term is used for distinguishing the respective surfaces for convenience and is not related to actual vertical and transverse directions.

Preferred Embodiment

<Method of Manufacturing Board Integrated Electrode>

FIGS. 1 to 5 are views illustrating a process for manufacturing a board integrated electrode 10 in a semiconductor device according to the present preferred embodiment of the present invention.

Figure 1:
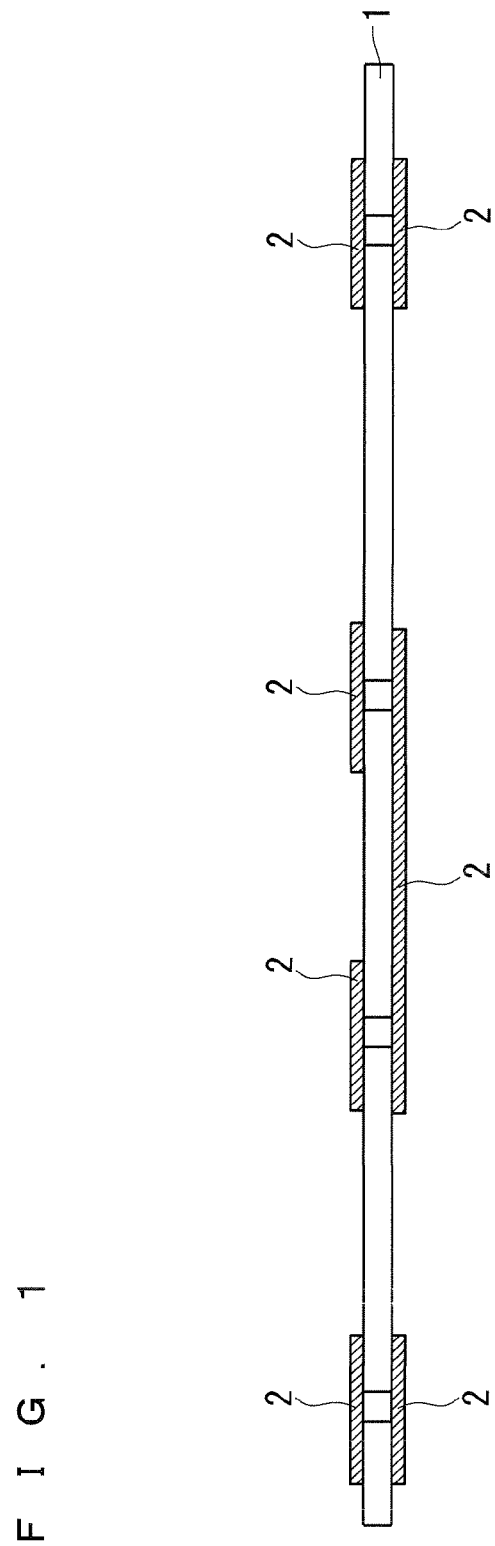
FIGS. 1 to 5 are views each illustrating a process for manufacturing a board integrated electrode in a semiconductor device according to a preferred embodiment of the present invention.

First of all, as illustrated in FIG. 1, a control circuit pattern 2 is fabricated on both sides of a double printed board 1. The control circuit pattern 2 is formed by a copper material, for example.

Figure 2:
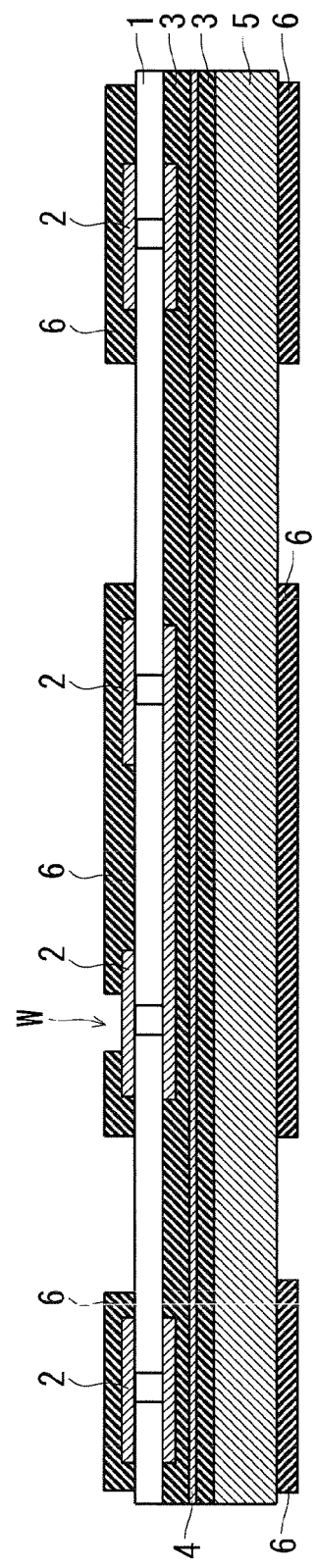

As shown in FIG. 2, next, an epoxy sheet 3 constituted by an epoxy resin is provided on a lower surface side of the double printed board 1, and furthermore, a plate electrode 5 is provided on a lower surface side of the epoxy sheet 3.

The epoxy sheet 3 is an epoxy prepreg obtained by impregnating a glass cloth to be used for a printed board with the epoxy resin, for example, and is reinforced with a shield 4 which is provided on a surface or an inner part of the epoxy sheet 3 and is constituted by a copper plate or a mesh-like copper material. The shield 4 is not an indispensable structure. By providing the structure, however, it is possible to reduce a noise which might be made at high-frequency switching of an SiC device or the like.

The plate electrode 5 is an electrode which is constituted by a copper material and causes principal current to flow.

In addition, a solder resist 6 constituted by resist, polyamide, polyamide-imide or polyimide is patterned onto an upper surface side of the double printed board 1. Although the solder resist 6 is provided in such a way as to cover the control circuit pattern 2, the solder resist 6 is not provided in a wire bond portion W of the control circuit pattern 2 and a portion where punching is to be carried out in a subsequent step. The control circuit pattern 2 is coated with the solder resist 6, so that a mold resin 17 to be provided in a subsequent step can be prevented from being peeled. In a heat cycle in the provision of the mold resin 17 through transfer molding, consequently, a stress acts due to a difference among a coefficient of linear expansion of the mold resin 17, a coefficient of linear expansion of a Cu material to be a material of the control circuit pattern 2 and a coefficient of linear expansion of an epoxy resin material to be a material of the epoxy sheet 3 so that the peeling of the mold resin 17 can be prevented from occurring. When the peeling occurs, a characteristic of the device is deteriorated.

On the other hand, the solder resist 6 is also provided on a lower surface side of the plate electrode 5 corresponding to a position in which the solder resist 6 is provided on the upper surface side of the double printed board 1. By providing the solder resist 6 on the lower surface side of the plate electrode 5, it is possible to enhance the peeling suppressing effect more greatly. The solder resist 6 to be disposed on the lower surface side of the plate electrode 5 is prevented from being provided in the portion where the punching is to be carried out in the subsequent step.

Figure 3:
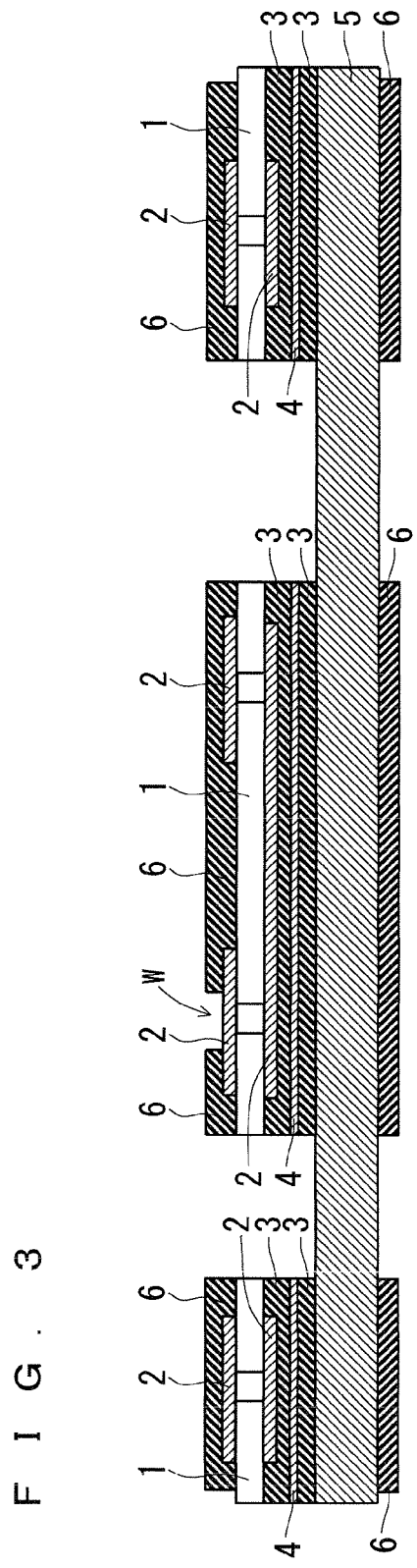

As shown in FIG. 3, then, the epoxy sheet 3 in a portion which is subjected to punching and embossing in a subsequent step is removed by a milling cutter or laser processing.

Figure 4:
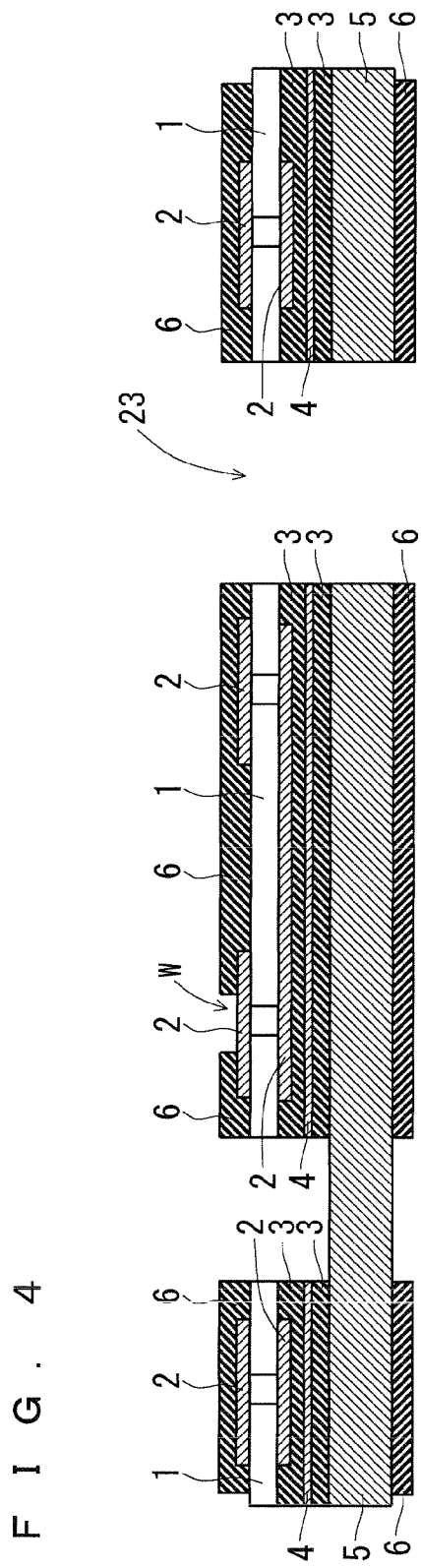

As shown in FIG. 4, next, a portion for confirming a solder fillet is removed by the punching. Thus, an opening portion 23 is formed.

Figure 5:
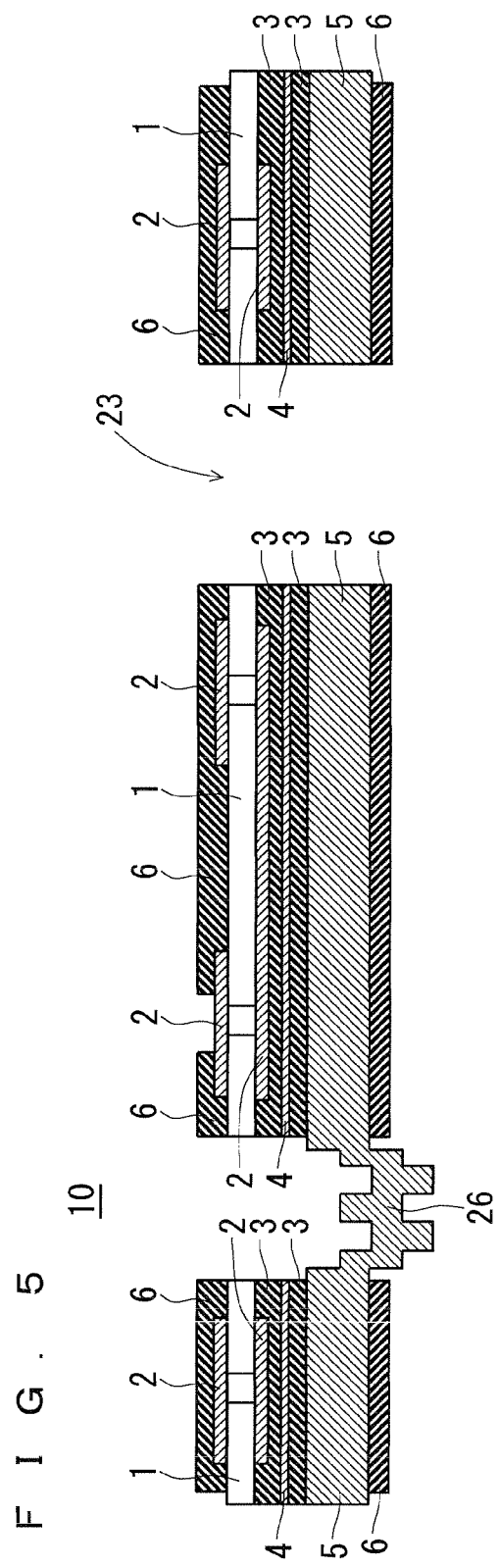

As shown in FIG. 5, subsequently, a bonding portion 26 to a power semiconductor device 12 which will be described below is subjected to the embossing.

By the embossing, the plate electrode 5 of the bonding portion 26 to the power semiconductor device 12 takes a concave shape toward the lower surface side (a convex shape toward the power semiconductor device 12 side). The embossing is disclosed in the Japanese Patent Application Laid-Open No. 2012-74543, for example. The exposed plate electrode 5 is subjected to the embossing, so that reliability of electrical connection to the power semiconductor device 12 can be enhanced.

Through the manufacturing process described above, it is possible to implement the board integrated electrode 10 in which a conventional control board for carrying out gate driving for an MOSFET or an IGBT of the power semiconductor device 12 is integrated with the plate electrode for causing principal current to flow through the epoxy sheet.

<Structure of Semiconductor Device>

Figure 6:
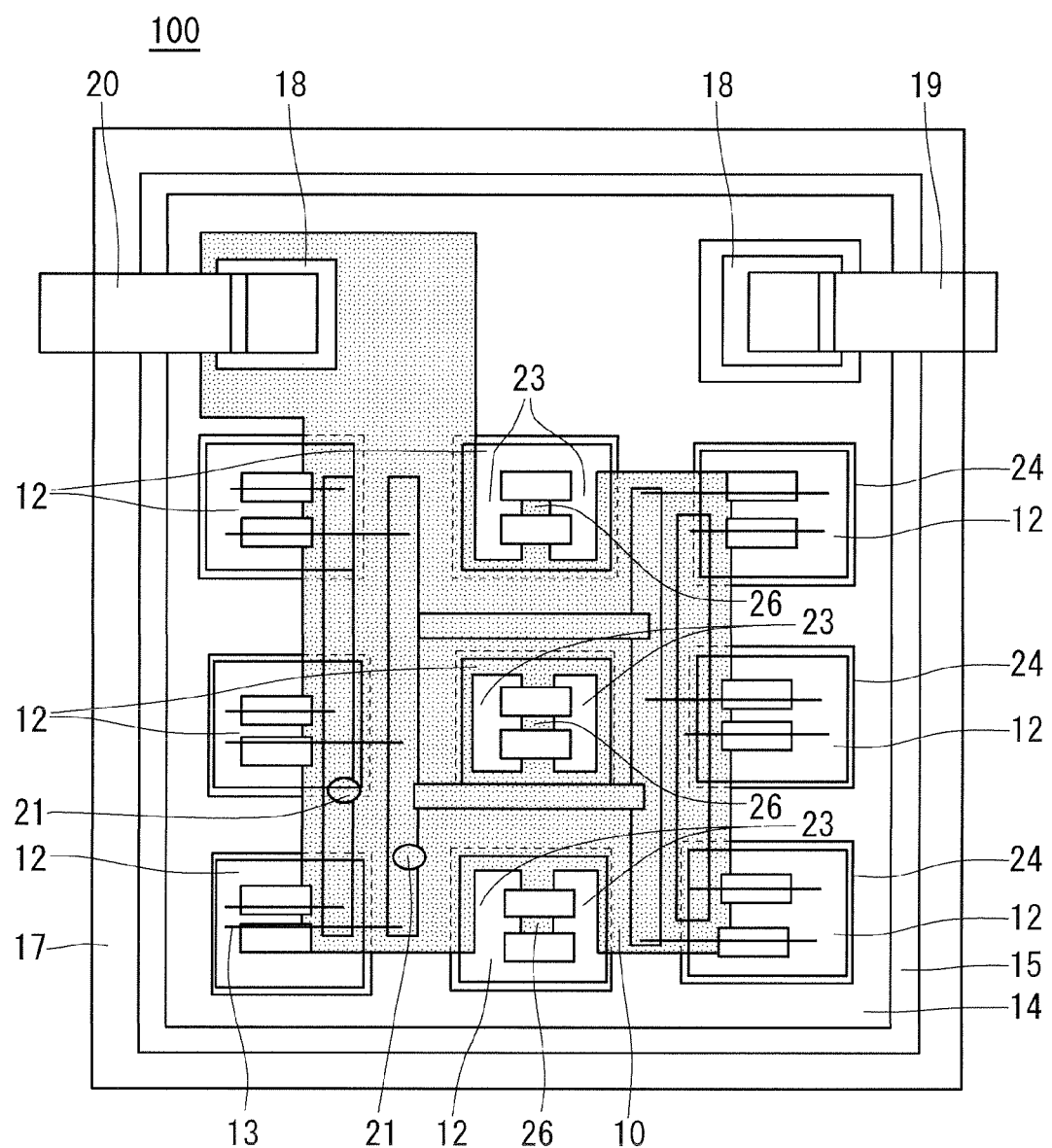
FIG. 6 is a top view illustrating the semiconductor device according to the preferred embodiment of the present invention.

FIG. 6 is a top view illustrating a semiconductor device 100 according to the present preferred embodiment of the present invention. Moreover, FIG. 7 is a sectional view illustrating the semiconductor device 100 according to the present preferred embodiment of the present invention.

As shown in FIG. 7, an insulating layer 15 is provided on a base plate 16 formed of a metal having a high thermal conductivity such as copper or AlSiC, and furthermore, a heat spreader 14 is disposed on the insulating layer 15.

The power semiconductor devices 12 are die-bonded onto the heat spreader 14 through a bonding material 24 such as a solder. Moreover, the board integrated electrode 10 (see FIGS. 1 to 5) is provided over the power semiconductor devices 12. The board integrated electrode 10 is also extended over the heat spreader 14. The power semiconductor device 12 and the board integrated electrode 10 are electrically connected to each other through the bonding material 24 such as a solder or silver in a bonding portion 26 or the like. By disposing the board integrated electrode 10 on an upper surface side of the power semiconductor device 12, that is, a cathode side, it is possible to raise a withstand voltage of the device through the insulating layer 15 having a smaller thickness. Thus, it is possible to reduce the cost of the material. If there is provided the insulating layer 15 having a corresponding thickness to a sufficiently lower control voltage than a principal voltage, for example, an electric potential difference of approximately ±15V of a gate electrode, required performance is fully satisfied so that a cost can also be reduced by decrease in thickness.

Figure 30:
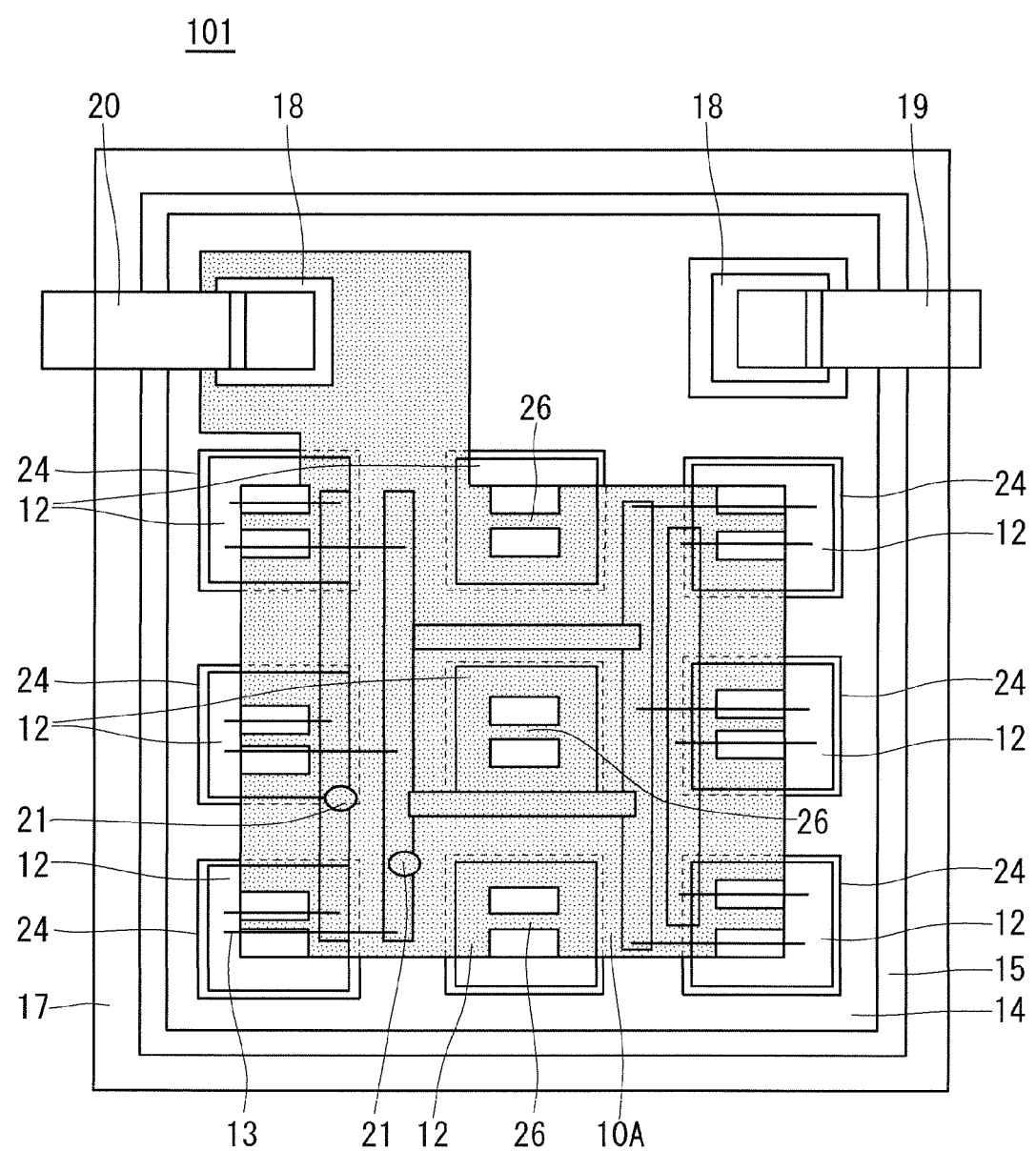
FIG. 30 is a top view illustrating a semiconductor device according to a variant of the preferred embodiment in accordance with the present invention.
Figure 31:
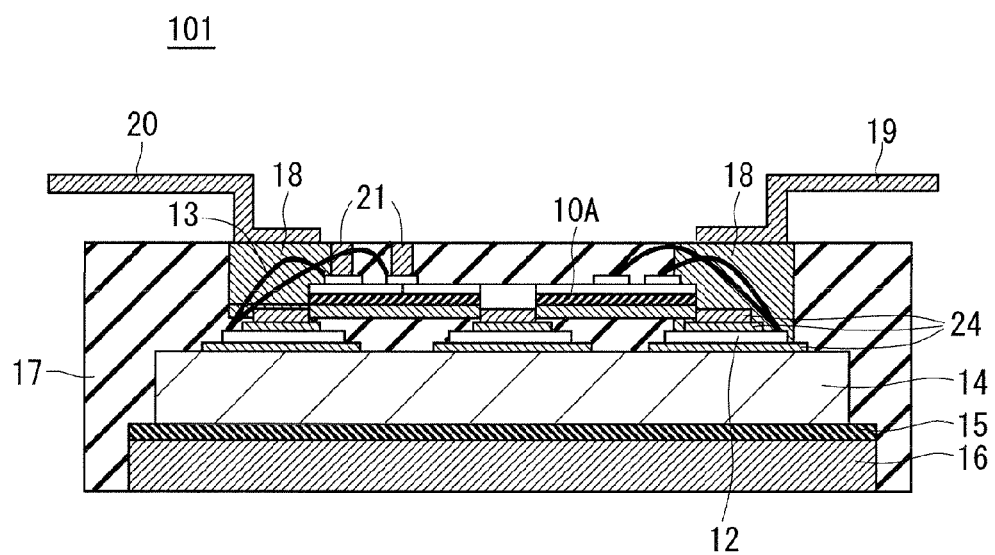
FIG. 31 is a sectional view illustrating the semiconductor device according to the variant of the preferred embodiment in accordance with the present invention.

Here, the opening portion 23 is provided in a peripheral part of the bonding portion 26 to the power semiconductor device 12 in the board integrated electrode 10. Consequently, it is easy to visually confirm whether the electrical connection between the power semiconductor device 12 and the board integrated electrode 10 is properly carried out or not. Accordingly, it is possible to easily ensure quality of the semiconductor device 100. However, the opening portion 23 is not an indispensable structure and it is also possible to assume a semiconductor device 101 in which the opening portion 23 is not provided as illustrated in FIGS. 30 and 31 which will be described below.

The board integrated electrode 10 and the power semiconductor device 12 (an MOSFET or an IGBT) are electrically connected to each other by an electric conductor such as an aluminum wire 13 or the like. More specifically, the board integrated electrode 10 and a gate pad or an emitter (source) pad of the power semiconductor device 12 are electrically connected to each other. Consequently, it is possible to control the power semiconductor device 12 from an outside through the board integrated electrode 10 and a control terminal 21. The control terminal 21 is electrically connected at an upper surface side of the board integrated electrode 10.

As shown in FIG. 6, moreover, an electrode block 18 is disposed on the heat spreader 14 through a bonding material. Furthermore, the electrode block 18 is also disposed, through a bonding material, on the board integrated electrode 10 extending over the heat spreader 14.

In addition, the whole device is covered with the mold resin 17 in such a manner that the electrode block 18 is exposed, and an anode terminal 19 and a cathode terminal 20 are US (Ultra Sonic) bonded to the electrode block 18 exposed to an upper surface of the mold resin 17 respectively. Thus, there is formed a semiconductor device connected to a bus bar of a driving device.

<Semiconductor Device Manufacturing Method 1>

FIGS. 8 to 17 are views illustrating a process for manufacturing the semiconductor device 100 according to the present preferred embodiment of the present invention.

Figure 8:
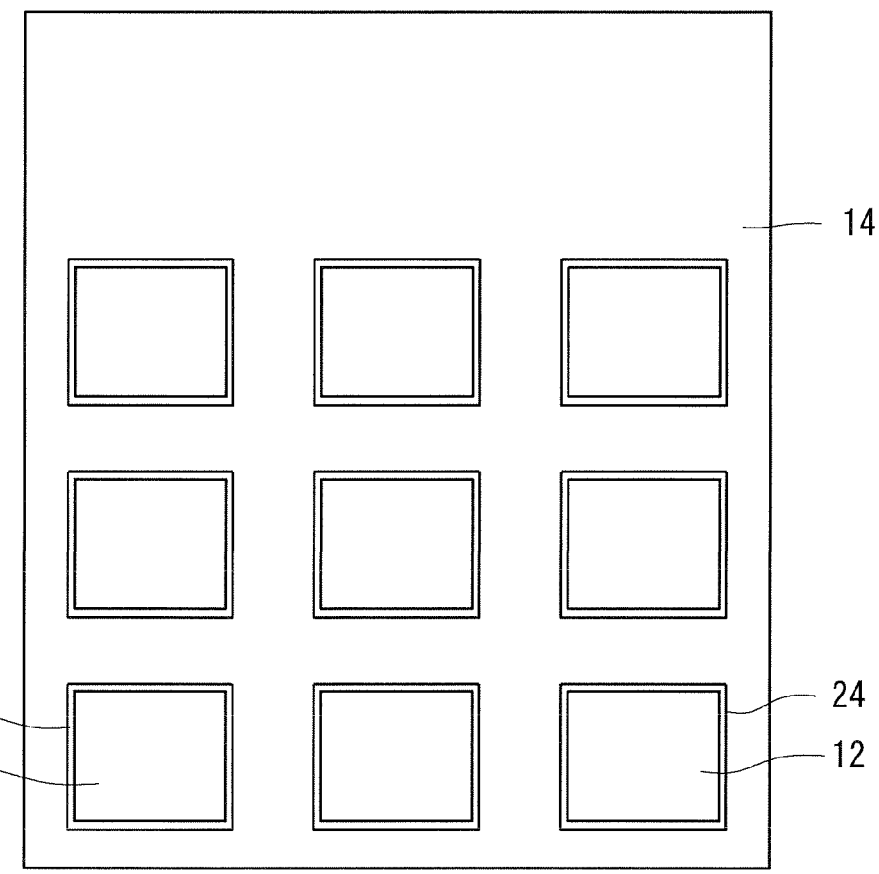
Figure 9:
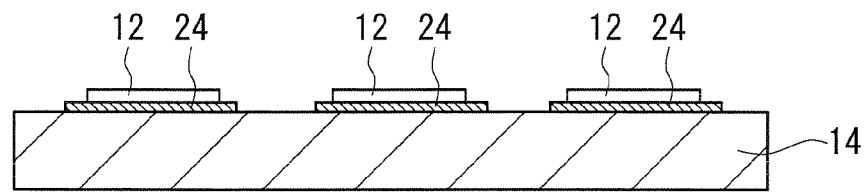

First of all, as illustrated in FIGS. 8 and 9, the power semiconductor devices 12 are disposed on the heat spreader 14 through the bonding materials 24.

Figure 10:
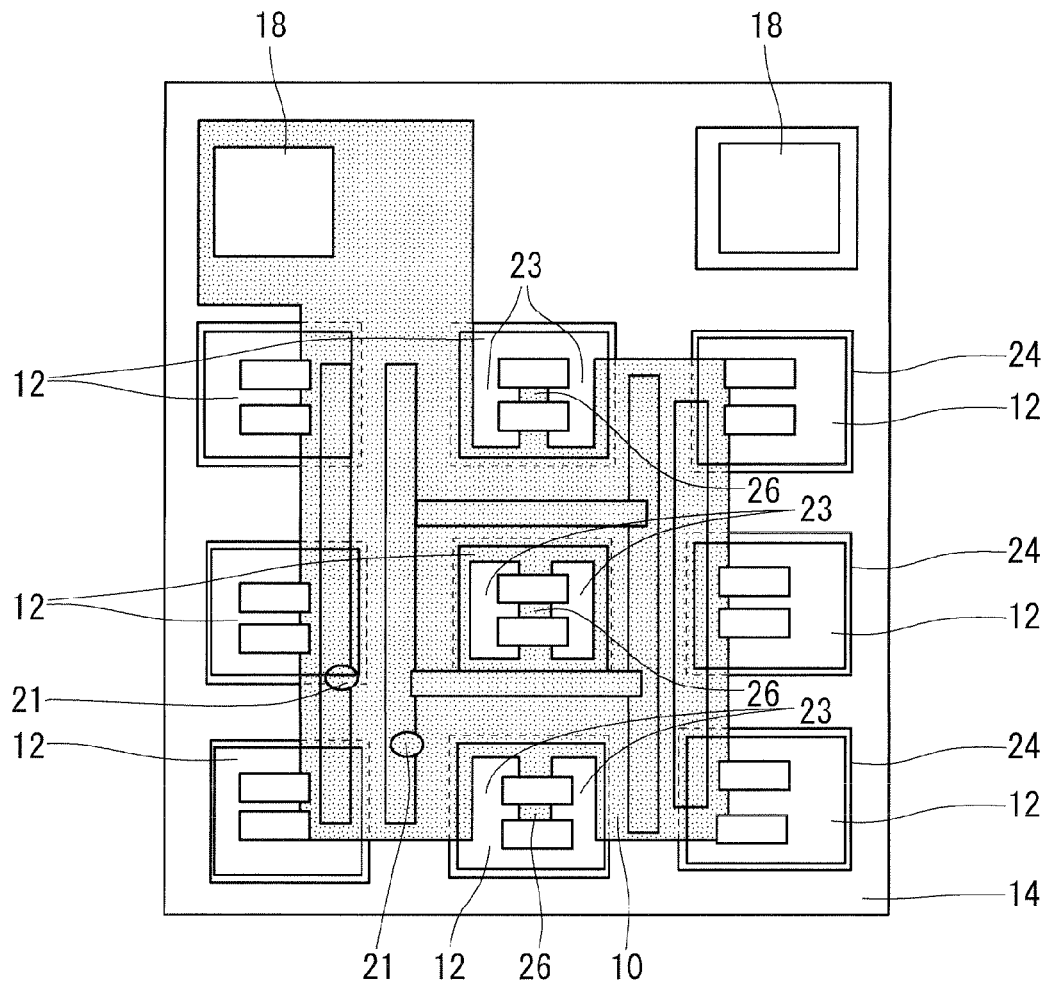
Figure 11:
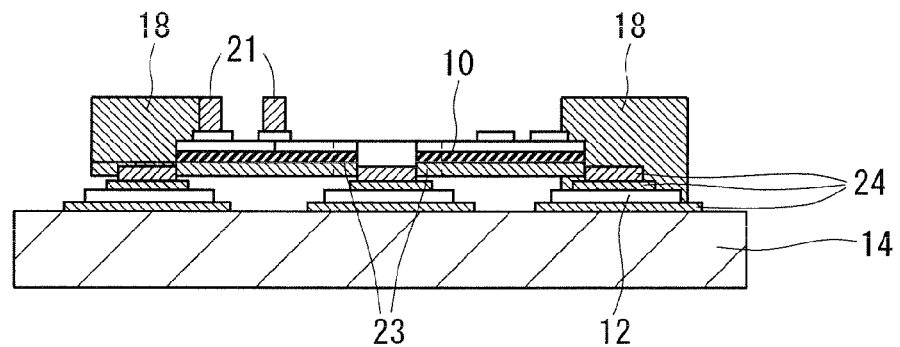

As shown in FIGS. 10 and 11, next, there is disposed the board integrated electrode 10 which is electrically connected to the power semiconductor device 12 through the bonding material 24 across the power semiconductor device 12. The connection is carried out in the bonding portion 26 or the like. The board integrated electrode 10 also extends over the heat spreader 14.

Moreover, the electrode block 18 is disposed on the heat spreader 14 through the bonding material. Furthermore, the electrode block 18 is disposed, through the bonding material, on the board integrated electrode 10 which extends over the heat spreader 14.

In addition, the control terminal 21 is electrically connected at the upper surface side of the board integrated electrode 10.

Figure 12:
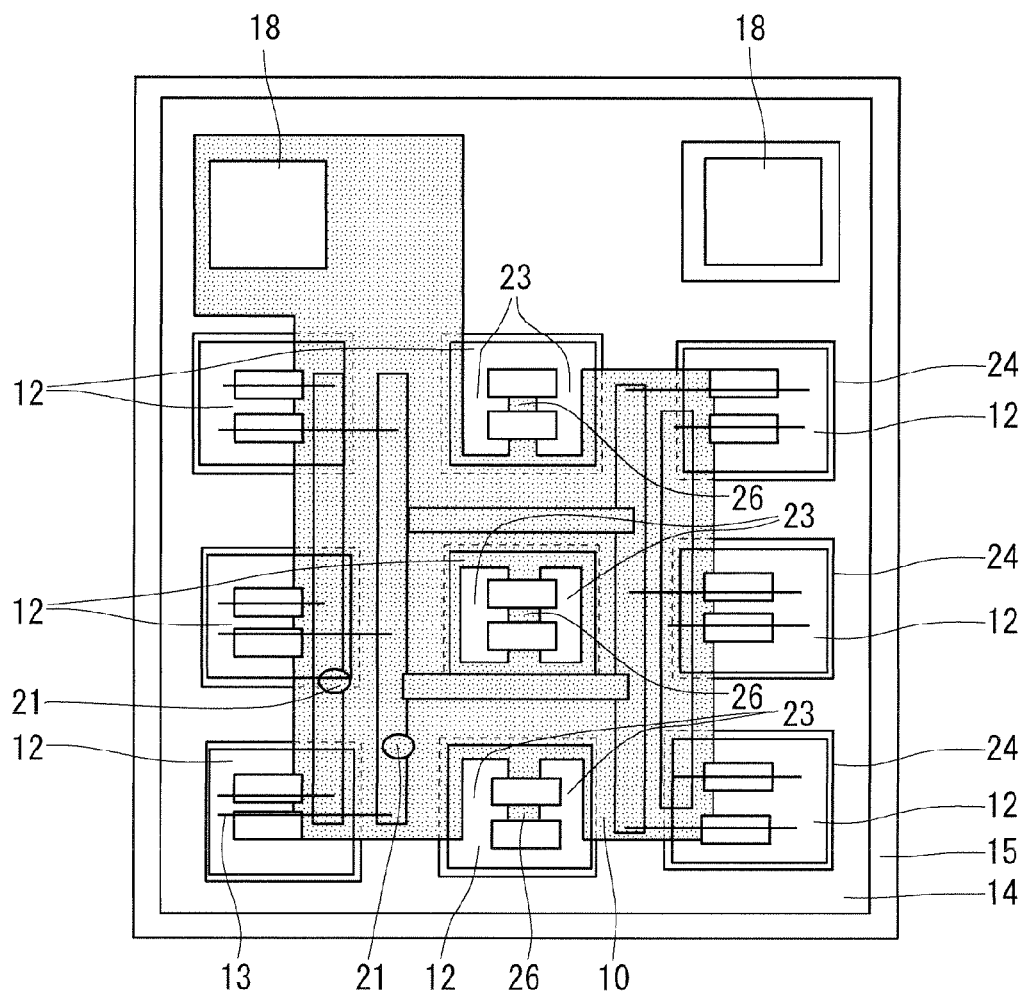
Figure 13:
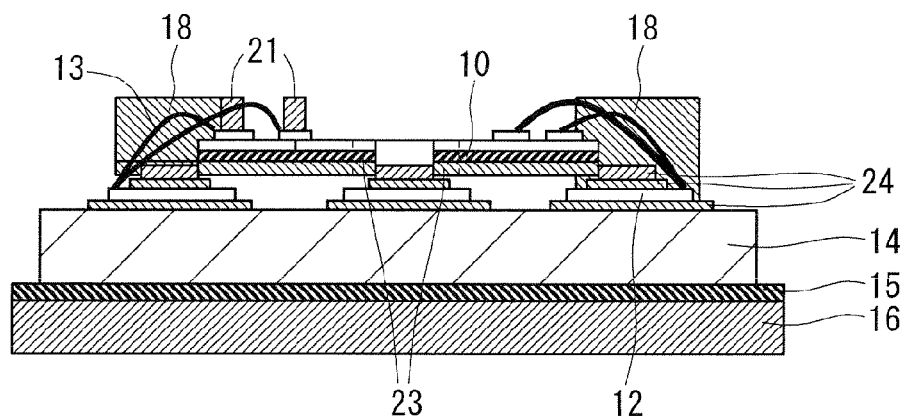

As shown in FIGS. 12 and 13, subsequently, the insulating layer 15 is formed on the lower surface side of the heat spreader 14, and furthermore, the base plate 16 is provided on the lower surface side of the insulating layer 15.

In addition, the aluminum wire 13 is disposed to electrically connect the board integrated electrode 10 to the power semiconductor device 12. More specifically, the aluminum wire 13 electrically connects the board integrated electrode 10 to the gate pad or emitter (source) pad of the power semiconductor device 12.

As shown in FIGS. 14 and 15, then, the mold resin 17 is provided to cover the whole device in such a manner that the electrode block 18 is exposed.

As shown in FIGS. 16 and 17, thereafter, the anode terminal 19 and the cathode terminal 20 are US (Ultra Sonic) bonded to the electrode block 18 exposed to the upper surface of the mold resin 17 respectively. Thus, there is formed the semiconductor device to be connected to the bus bar of the driving device.

<Semiconductor Device Manufacturing Method 2>

FIGS. 18 to 29 are views each illustrating a further mode of the process for manufacturing the semiconductor device 100 according to the present preferred embodiment of the present invention. In the following description, different steps from those in the semiconductor device manufacturing method 1 will be described and description of the same steps as those in the semiconductor device manufacturing method 1 will be omitted.

Figure 18:
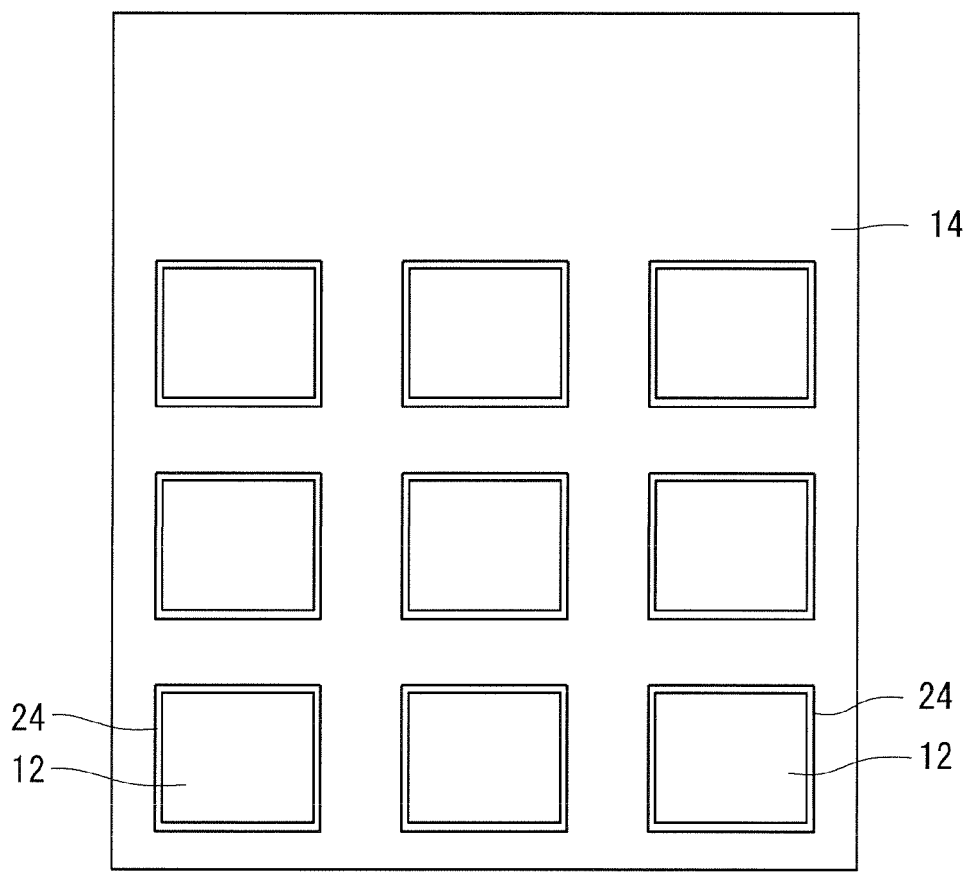
Figure 19:
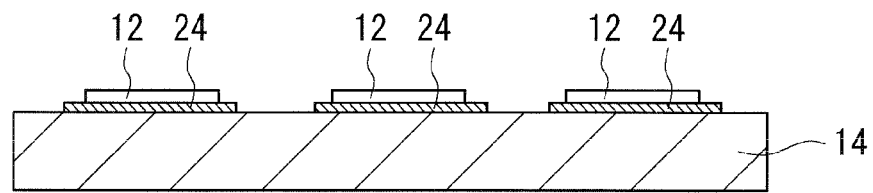
Figure 20:
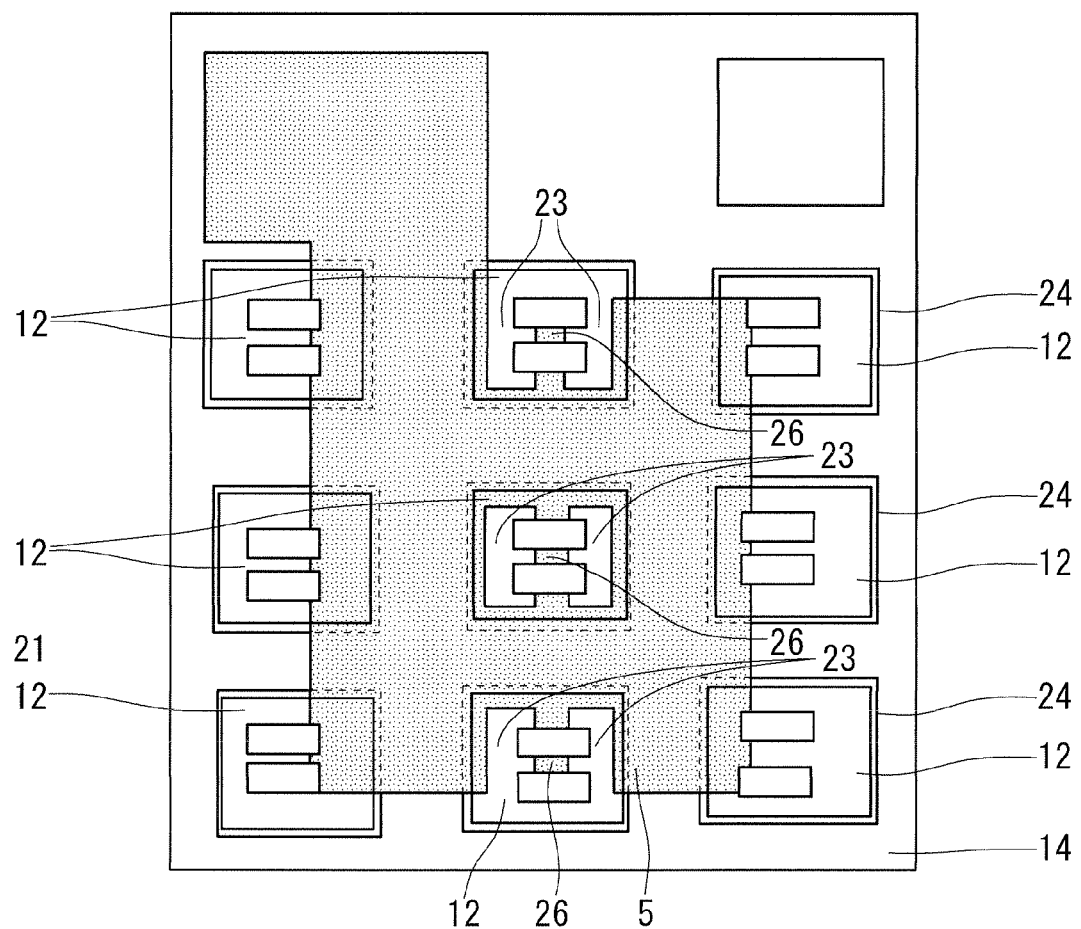
Figure 21:
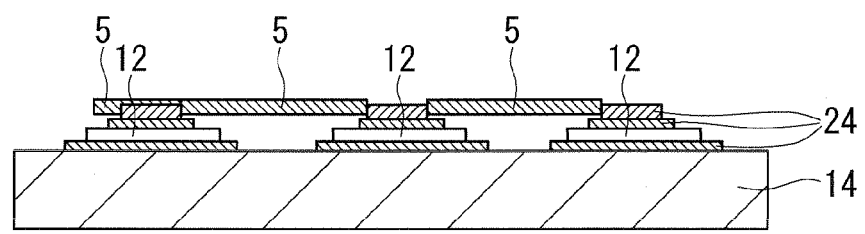

As shown in FIGS. 18 and 19, the power semiconductor devices 12 are disposed on the heat spreader 14 through the bonding materials 24. As shown in FIGS. 20 and 21, then, the plate electrode 5 connected electrically to the power semiconductor device 12 through the bonding material 24 is disposed across the power semiconductor device 12. The connection is carried out in the bonding portion 26 or the like. The plate electrode 5 is also extended over the heat spreader 14.

Figure 22:
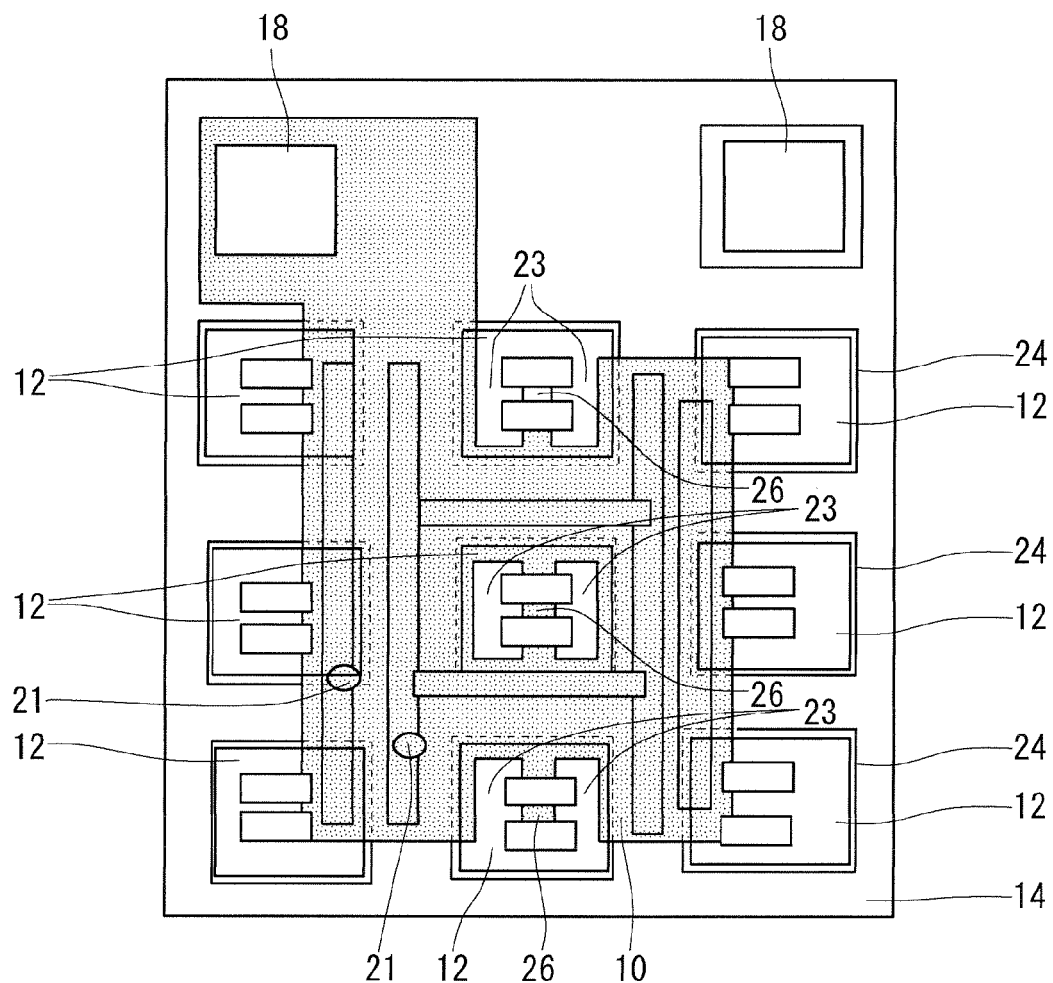
Figure 23:
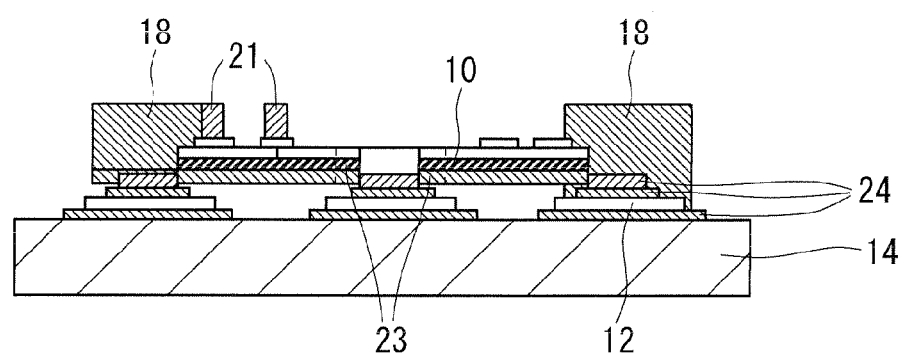
Figure 24:
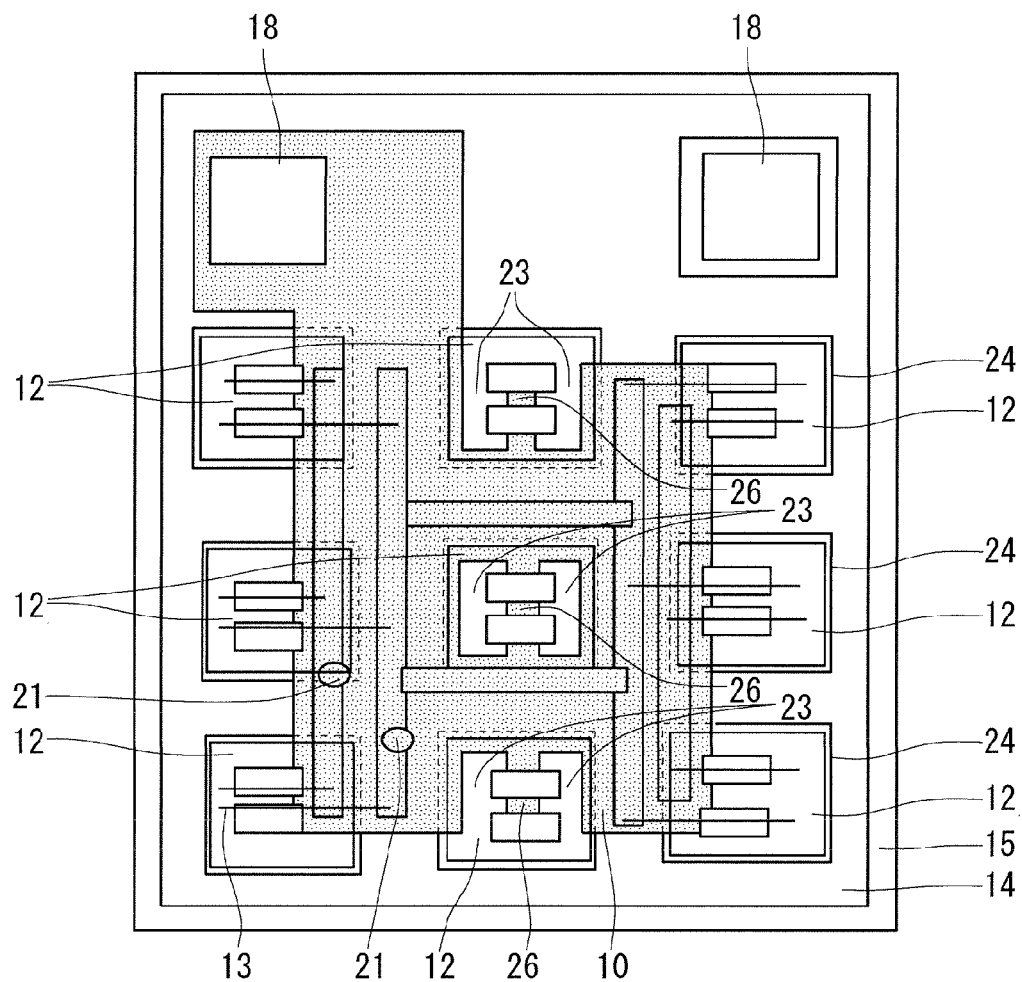
Figure 25:
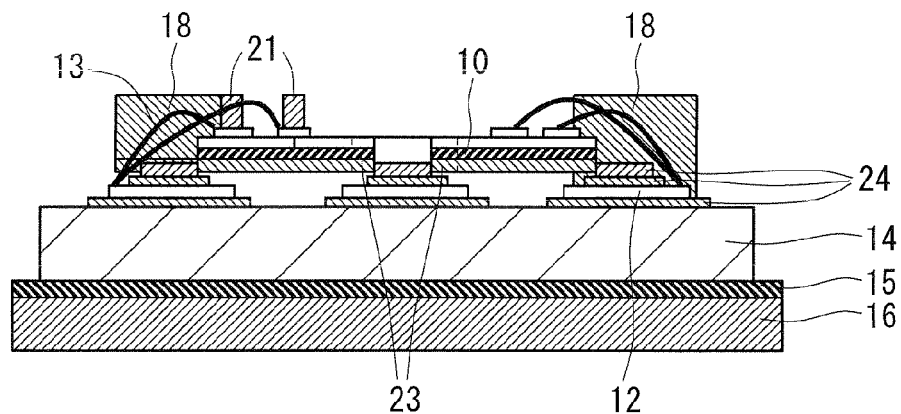
Figure 26:
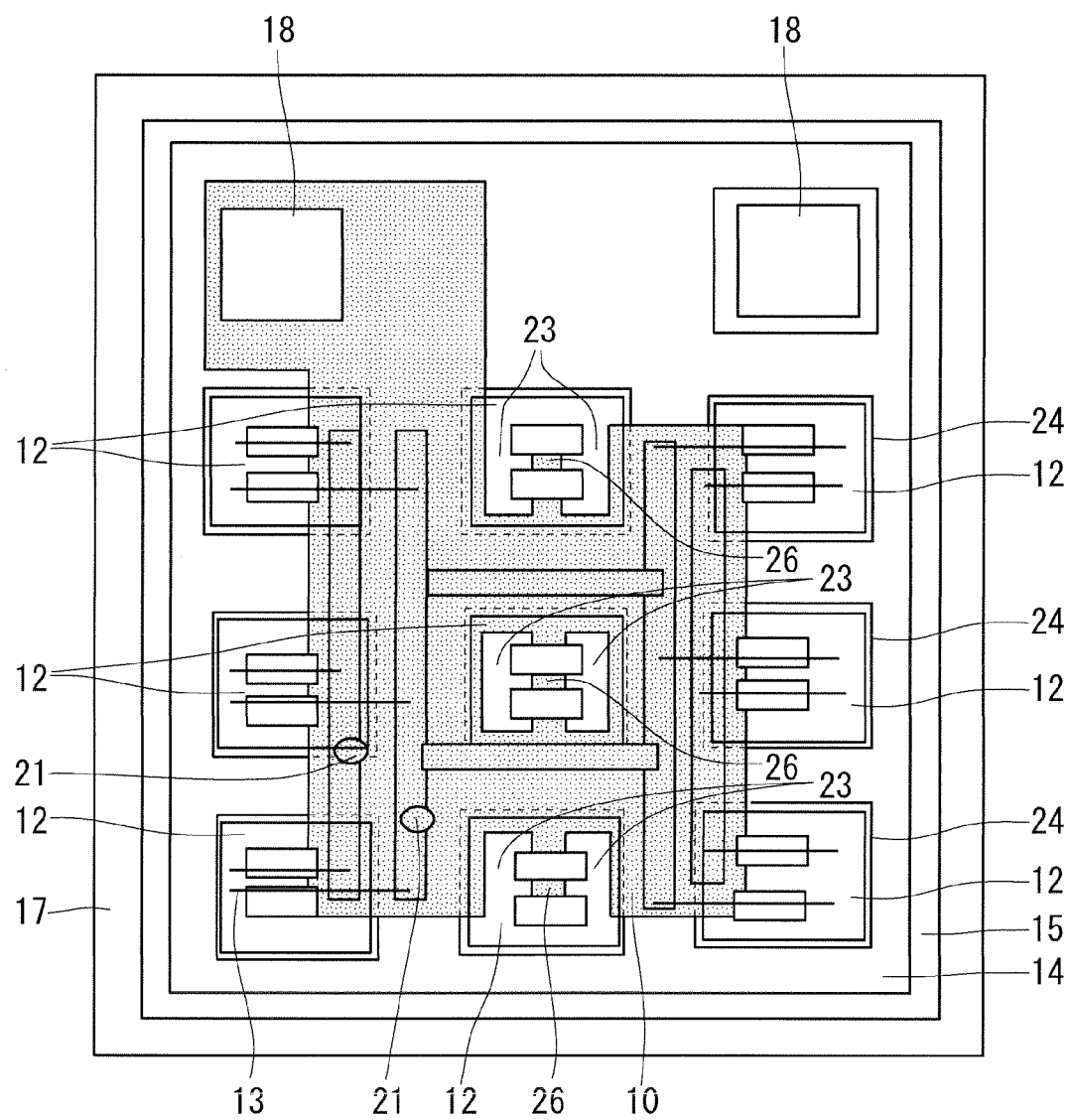
Figure 28:
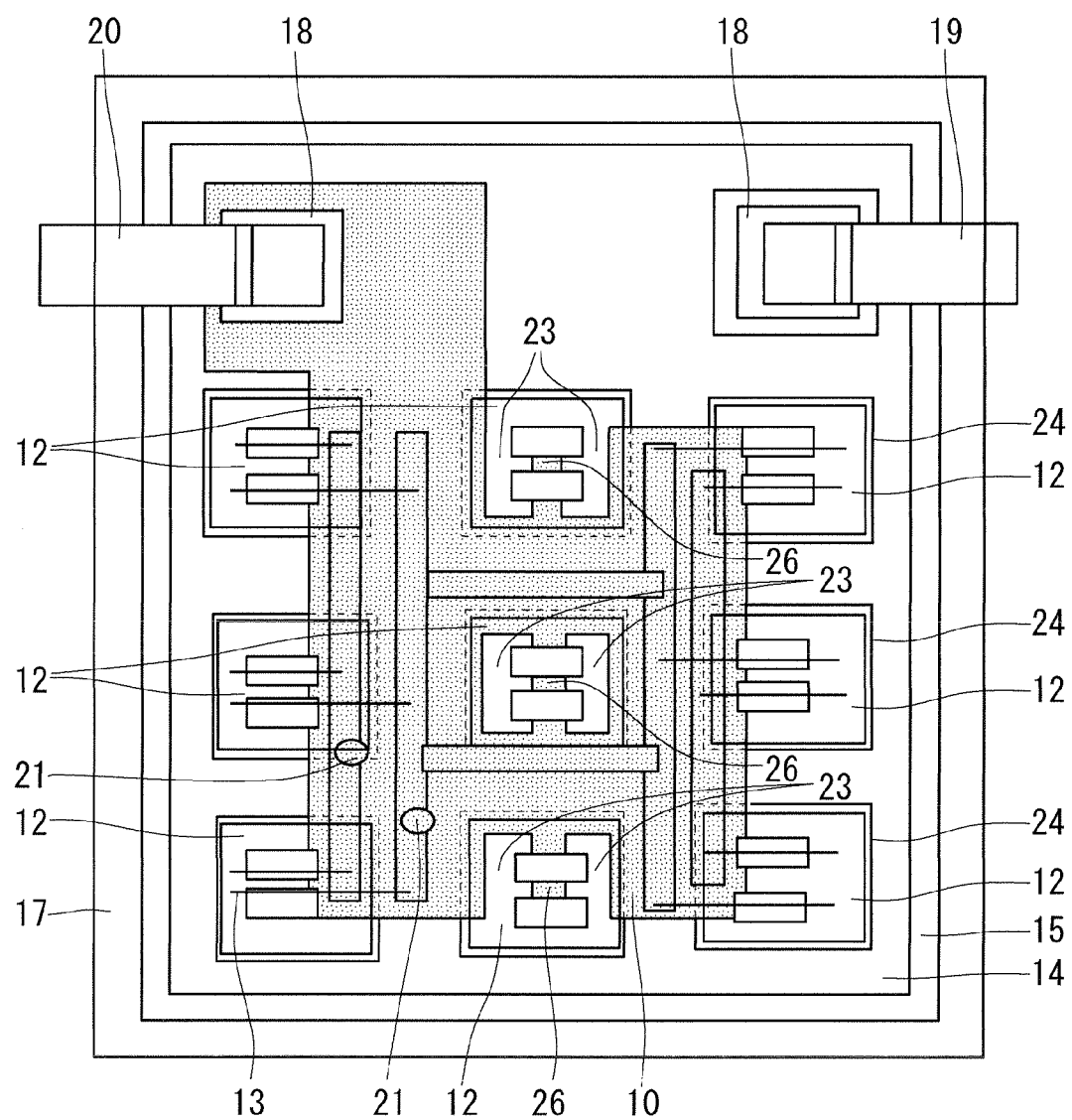

As shown in FIGS. 22 and 23, next, the double printed board 1 or the like is disposed on the plate electrode 5 through the epoxy sheet 3, so that the board integrated electrode 10 is formed. Moreover, the electrode block 18 is disposed, through the bonding material, on the heat spreader 14 and the board integrated electrode 10 extending over the heat spreader 14.

Moreover, the control terminal 21 is electrically connected at the upper surface side of the board integrated electrode 10.

The following steps (FIGS. 24 to 29) are the same as those in the semiconductor device manufacturing method 1.

In the case where the double printed board 1 or the like is disposed on the plate electrode 5 as described above, there are supposed, for example, as disposing methods, a method of carrying out disposition by bonding the double printed board 1 through a solder or the like and a method of carrying out disposition by causing the double printed board 1 to adhere with an adhesive double coated tape or the like.

In the case where the double printed board 1 is disposed by bonding with a solder or the like, however, it is supposed to use the solder or the like in the bond between the heat spreader 14 and the power semiconductor device 12. For this reason, a solder reflow is required twice, so that a processing cost is increased. In some cases in which solder bonding is executed over the upper surface of the power semiconductor device 12, moreover, the solder protruded from a bonding surface thereof becomes ball-shaped and sticks to the surface of the power semiconductor device 12.

On the other hand, in the case where the double printed board 1 is disposed by bonding with the adhesive double coated tape or the like, it is necessary to execute wire bonding through US bond in order to electrically connect the double printed board 1 to the power semiconductor device 12. However, a necessary strength for the wire bonding to the double printed board 1 cannot be obtained between the double printed board 1 and the plate electrode 5. For this reason, the reliability of the wire bonding cannot be ensured in some cases. Moreover, a work for storing and pasting a tape cannot be carried out easily, so that the processing cost is increased in some cases.

<Technical Premise>

Figure 32:
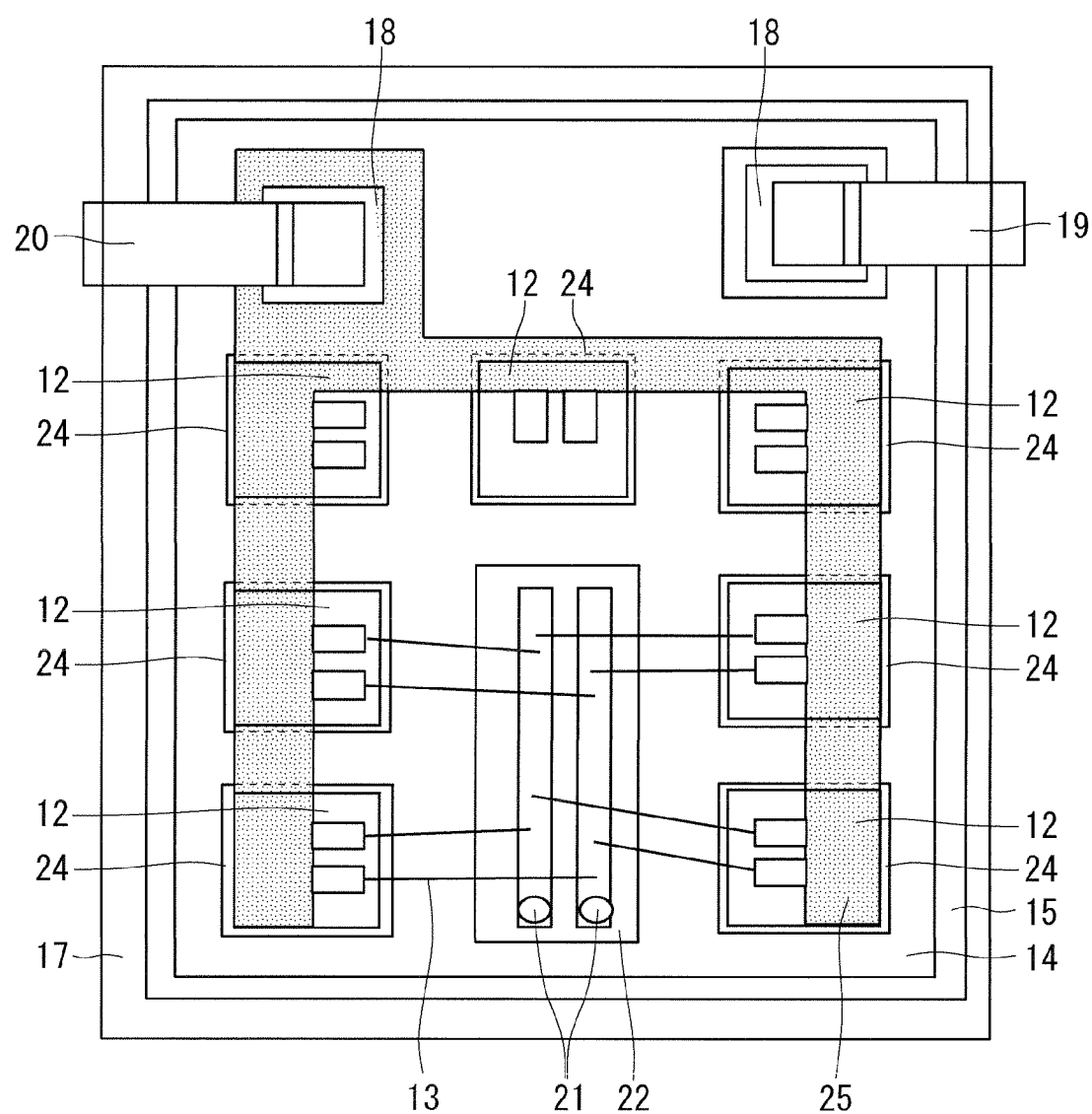
FIG. 32 is a top view illustrating a semiconductor device according to the technical premise of the present invention.

FIG. 32 is a top view illustrating a semiconductor device 102 according to the technical premise of the present invention. Moreover, FIG. 33 is a sectional view illustrating the semiconductor device 101 according to the technical premise of the present invention.

As shown in FIGS. 32 and 33, in the case where a substrate 22 is disposed on the heat spreader 14, only four chips of the power semiconductor device 12 (an MOSFET or an IGBT) can be mounted. In the present invention, however, six chips can be mounted, so that high density mounting is implemented.

In the present preferred embodiment, the substrate 22 and a plate electrode 25 in FIGS. 32 and 33 are integrated, so that it is possible to simplify the process as illustrated in FIGS. 8 to 19, and furthermore, to implement the board integrated electrode 10 which can easily carry out the wire bonding of the power semiconductor device 12 onto the substrate according to the present invention.

<Variant>

FIG. 30 is a top view illustrating the semiconductor device 101 according to a variant of the present preferred embodiment in accordance with the present invention. Moreover, FIG. 31 is a sectional view illustrating the semiconductor device 101 according to the variant of the present preferred embodiment in accordance with the present invention.

In the semiconductor device 101 shown in FIGS. 30 and 31, the opening portion 23 is not provided in the peripheral part of the bonding portion of the board integrated electrode 10A to the power semiconductor device 12. Since the other structures are the same as those in the semiconductor device 100, detailed description will be omitted.

<Effect>

According to the preferred embodiment of the present invention, the semiconductor device includes the plate electrode 5 to be a plate-shaped electrode member, the epoxy sheet 3 serving as an integrated insulating sheet and provided on the plate electrode 5, the double printed board 1 serving as a control board and provided on the epoxy sheet 3, and the board integrated electrode 10 in which the plate electrode 5 and the double printed board 1 are integrally formed through the epoxy sheet 3.

According to the structure, there is provided the board integrated electrode 10 in which the plate electrode 5 and the double printed board 1 are integrally formed through the epoxy sheet 3. Consequently, it is possible to easily carry out the manufacture while enlarging an element mounting region and implementing increase in a capacity. Since the manufacturing process can be simplified, a manufacturing cost can also be reduced.

According to the preferred embodiment of the present invention, moreover, the double printed board 1 has the control circuit pattern 2 on both sides thereof. In addition, the semiconductor device includes the solder resist 6 serving as an upper surface resist layer and provided on the upper surface of the double printed board 1 with the control circuit pattern 2 covered.

According to the structure, in the heat cycle in the provision of the mold resin 17 through the transfer molding, a stress acts due to a difference among the coefficient of linear expansion of the mold resin 17, the coefficient of linear expansion of a Cu material to be a material of the control circuit pattern 2 and the coefficient of linear expansion of an epoxy resin material to be a material of the epoxy sheet 3, so that the peeling of the mold resin 17 can be prevented from occurring.

According to the preferred embodiment of the present invention, moreover, the epoxy sheet 3 has the shield 4 serving as a plate- or mesh-like metal shield layer on the surface or inner part thereof.

According to the structure, it is possible to suppress occurrence of a noise which might be made in the execution of the high-frequency switching in an SiC device or the like.

According to the preferred embodiment of the present invention, moreover, the board integrated electrode 10 is bonded to the power semiconductor device 12 serving as a semiconductor element, and the opening portion 23 is formed around the bonding portion.

According to the structure, the peripheral part of the bonding portion of the power semiconductor device 12 and the board integrated electrode 10 is set to be the opening portion 23. Consequently, it is possible to easily confirm a conduction state of the bonding portion through a visual inspection or the like. Thus, it is possible to enhance the reliability of the semiconductor device.

According to the preferred embodiment of the present invention, furthermore, the board integrated electrode 10 is bonded to the power semiconductor device 12, so that the convex shape is made on the power semiconductor device 12 side in the bonding portion 26 in which they are bonded to each other.

According to the structure, the exposed plate electrode 5 is subjected to the embossing. Consequently, it is possible to enhance the reliability of the electrical connection to the power semiconductor device 12. By making the shape through the embossing, moreover, it is possible to easily ensure a clearance for relieving the influence of an electric field between the power semiconductor device 12 and the plate electrode 5. Thus, it is possible to increase the density of the device more greatly as compared with the case in which the convex shape is made by bending.

According to the preferred embodiment of the present invention, moreover, the method of manufacturing a semiconductor device includes the steps of (a) providing the epoxy sheet 3 serving as an integrated insulating sheet on the plate electrode 5 to be a plate-shaped electrode member, (b) providing the double printed board 1 serving as a control board on the epoxy sheet 3 and integrally forming the plate electrode 5 and the double printed board 1 through the epoxy sheet 3, and (c) electrically connecting the board integrated electrode 10 formed integrally in the step (b) to the power semiconductor device 12 serving as a semiconductor element.

According to the structure, the board integrated electrode 10 in an integral forming state is connected to the power semiconductor device 12. Therefore, the connecting work can easily be carried out, so that the process for manufacturing a semiconductor device can be simplified.

According to the preferred embodiment of the present invention, moreover, the method of manufacturing a semiconductor device includes the step (d) of forming the opening portion 23 around a portion in which the board integrated electrode 10 is bonded to the power semiconductor device 12 before the step (c).

According to the structure, it is easy to visually confirm whether the electrical connection between the power semiconductor device 12 and the board integrated electrode 10 is properly carried out or not, or the like. Accordingly, it is possible to easily ensure the quality of the semiconductor device 100.

According to the preferred embodiment of the present invention, furthermore, the method of manufacturing a semiconductor device includes the step (e) of making a convex shape on the power semiconductor device 12 side in the bonding portion 26 in which the board integrated electrode 10 is bonded to the power semiconductor device 12 before the step (c).

According to the structure, the exposed plate electrode 5 is subjected to the embossing. Consequently, it is possible to enhance the reliability of the electrical connection to the power semiconductor device 12.

According to the preferred embodiment of the present invention, moreover, the method of manufacturing a semiconductor device includes the steps of (f) of providing the control circuit pattern 2 on both sides of the double printed board 1 before the step (c) and (g) of providing, on the upper surface of the double printed board 1, the solder resist 6 serving as an upper surface resist layer and covering the control circuit pattern 2.

According to the structure, in the heat cycle in the provision of the mold resin 17 through the transfer molding, a stress acts due to a difference among the coefficient of linear expansion of the mold resin 17, the coefficient of linear expansion of a Cu material to be a material of the control circuit pattern 2 and the coefficient of linear expansion of an epoxy resin material to be a material of the epoxy sheet 3, so that the peeling of the mold resin 17 can be prevented from occurring.

Although quality of materials and the materials of the respective components, executing conditions and the like are also described in the preferred embodiment according to the present invention, these are illustrative and are not restricted to the description.

It is to be noted that arbitrary components in the preferred embodiment of the invention may be changed or omitted without departing the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a plate-shaped electrode member;
   an integrated insulating sheet provided on said plate-shaped electrode member;
   a control board provided on said integrated insulating sheet, said control board having a circuit pattern on both sides thereof;
   a board integrated electrode in which said plate-shaped electrode member and said control board are integrally formed by said integrated insulating sheet;
   an upper surface resist layer provided on an upper surface of said control board with said circuit pattern covered; and
   a lower surface resist layer provided on a lower surface of said plate-shaped electrode member corresponding to a position in which said upper surface resist layer is provided.

2. The semiconductor device according to claim 1, wherein said integrated insulating sheet has a plate or mesh metal shield layer on a surface or inner part thereof.

3. A semiconductor device comprising:
   a plate-shaped electrode member;
   an integrated insulating sheet provided on said plate-shaped electrode member;
   a control board provided on said integrated insulating sheet;
   a board integrated electrode in which said plate-shaped electrode member and said control board are integrally formed by said integrated insulating sheet; and
   a semiconductor element connected electrically to said board integrated electrode;
   wherein said board integrated electrode is bonded to said semiconductor element and a convex shape is made on a semiconductor element side of the board integrated electrode in a bonding portion in which the bond is carried out.

4. The semiconductor device according to claim 3, wherein said board integrated electrode is bonded to said semiconductor element and an opening portion is formed around a portion in which the bond is carried out.

5. The semiconductor device according to claim 3, wherein said board integrated electrode is electrically connected to a cathode side of said semiconductor element.

* * * * *